US009485688B1

(12) United States Patent
Akhter et al.

(10) Patent No.: US 9,485,688 B1
(45) Date of Patent: Nov. 1, 2016

(54) METHOD AND APPARATUS FOR CONTROLLING ERROR AND IDENTIFYING BURSTS IN A DATA COMPRESSION SYSTEM

(71) Applicant: Integrated Device Technology, Inc., San Jose, CA (US)

(72) Inventors: Mohammad Shahanshah Akhter, Ottawa (CA); Brian Scott Darnell, Suwanee, GA (US); Steve Lamontagne, Ottawa (CA); Bachir Berkane, Ottawa (CA)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 270 days.

(21) Appl. No.: 14/050,210

(22) Filed: Oct. 9, 2013

(51) Int. Cl.
*H04W 4/00* (2009.01)
*H04W 28/06* (2009.01)

(52) U.S. Cl.
CPC .................................. *H04W 28/065* (2013.01)

(58) Field of Classification Search
CPC ..................................................... H04W 80/04
USPC ......................................................... 370/328
See application file for complete search history.

(56) References Cited

U.S. PATENT DOCUMENTS

| | | | |
|---|---|---|---|
| 5,999,561 A | 12/1999 | Naden et al. | |
| 6,192,259 B1 | 2/2001 | Hayashi | |
| 6,226,325 B1 | 5/2001 | Nakamura | |
| 6,240,084 B1 | 5/2001 | Oran et al. | |
| 6,263,503 B1 | 7/2001 | Margulis | |
| 6,449,596 B1 | 9/2002 | Ejima | |
| 6,728,778 B1 | 4/2004 | Brennan et al. | |
| 6,775,530 B2 | 8/2004 | Severson et al. | |
| 6,842,623 B2 | 1/2005 | Koskal | |
| 6,903,668 B1 | 6/2005 | Dror et al. | |
| 7,009,533 B1 | 3/2006 | Wegener | |

(Continued)

FOREIGN PATENT DOCUMENTS

WO         2005048625         5/2005

OTHER PUBLICATIONS

CPRI Specification V4.1, Commmon Public Interface (CPRI); Interface Specification, Feb. 1, 2009, 75 pages.

(Continued)

*Primary Examiner* — Christopher R Crompton
(74) *Attorney, Agent, or Firm* — Kenneth Glass; Molly Sauter; Glass & Associates

(57) ABSTRACT

The method and apparatus of the present invention provides for the compression and decompression of data bursts wherein the propagation of synchronization errors is limited to a desired number of signal samples and the start of a burst boundary is identified. In accordance with the present invention, a method and apparatus are provided for compressing data in a communication system by receiving data bursts comprising a plurality of uncompressed data packets at a compressor of the communication system, generating a start of burst parameter and a packet size parameter for each of the uncompressed data packets and compressing the data packets. At the decompressor, the compressed data packets are received and when a synchronization error occurs, the packet size parameter is used to limit the propagation of the error to a desired number of samples and to restore the data burst utilizing the start of burst parameter.

20 Claims, 12 Drawing Sheets

(56) References Cited

U.S. PATENT DOCUMENTS

| | | |
|---|---|---|
| 7,088,276 B1 | 8/2006 | Wegener |
| 7,142,519 B2 | 11/2006 | Saadeh et al. |
| 7,519,383 B2 | 4/2009 | Olgaard |
| 7,541,950 B2 | 6/2009 | Wegener |
| 7,564,861 B1 | 7/2009 | Subbiah |
| 7,599,283 B1 | 10/2009 | Varnier et al. |
| 7,623,894 B2 | 11/2009 | Vaglica et al. |
| 7,656,897 B2 | 2/2010 | Liu |
| 7,680,149 B2 | 3/2010 | Liu et al. |
| 7,706,477 B2 | 4/2010 | Larsson |
| 7,835,435 B2 | 11/2010 | Soni et al. |
| 7,852,797 B2 | 12/2010 | Kang et al. |
| 7,899,410 B2 | 3/2011 | Rakshani et al. |
| 7,924,949 B2 | 4/2011 | Larsson |
| 7,930,436 B1 | 4/2011 | Znosko |
| 7,961,807 B2 | 6/2011 | Kotecha et al. |
| 8,005,152 B2 | 8/2011 | Wegener |
| 8,018,910 B2 | 9/2011 | Jiang |
| 8,054,889 B2 | 11/2011 | Isu et al. |
| 8,089,854 B2 | 1/2012 | Persico |
| 8,108,910 B2 | 1/2012 | Conner, II et al. |
| 8,165,100 B2 | 4/2012 | Sabat et al. |
| 8,174,428 B2 | 5/2012 | Wegener |
| 8,176,524 B2 | 5/2012 | Singh et al. |
| 8,239,912 B2 | 8/2012 | Deng |
| 8,340,021 B2 | 12/2012 | Okeeffe et al. |
| 8,825,900 B1 | 9/2014 | Gross, IV et al. |
| 9,047,669 B1 | 6/2015 | Ostiguy |
| 9,055,472 B2 | 6/2015 | Evans et al. |
| 9,059,778 B2 | 6/2015 | Ling |
| 2002/0055371 A1 | 5/2002 | Arnon et al. |
| 2002/0136296 A1 | 9/2002 | Stone |
| 2002/0163965 A1 | 11/2002 | Lee et al. |
| 2003/0215105 A1 | 11/2003 | Sacha |
| 2004/0004943 A1 | 1/2004 | Kim |
| 2004/0062392 A1 | 4/2004 | Morton |
| 2004/0082365 A1 | 4/2004 | Sabach et al. |
| 2004/0198237 A1 | 10/2004 | Abutaleb et al. |
| 2004/0218826 A1 | 11/2004 | Terao |
| 2005/0104753 A1 | 5/2005 | Dror |
| 2005/0134907 A1 | 6/2005 | Obuchi et al. |
| 2005/0169411 A1 | 8/2005 | Kroeger |
| 2006/0233446 A1 | 10/2006 | Saito et al. |
| 2007/0070919 A1 | 3/2007 | Tanaka et al. |
| 2007/0076783 A1 | 4/2007 | Dishman et al. |
| 2007/0116046 A1 | 5/2007 | Liu et al. |
| 2007/0149135 A1 | 6/2007 | Larsson et al. |
| 2007/0160012 A1 | 7/2007 | Liu |
| 2007/0171866 A1 | 7/2007 | Merz et al. |
| 2007/0293180 A1 | 12/2007 | Rahman et al. |
| 2008/0025298 A1 | 1/2008 | Lev-Ran |
| 2009/0149221 A1 | 6/2009 | Liu et al. |
| 2009/0290632 A1 | 11/2009 | Wegener |
| 2010/0067366 A1 | 3/2010 | Nicoli |
| 2010/0202311 A1 | 8/2010 | Lunttla et al. |
| 2010/0246642 A1 | 9/2010 | Walton et al. |
| 2010/0285756 A1 | 11/2010 | Nakazawa |
| 2011/0280209 A1 | 11/2011 | Wegener |
| 2012/0008696 A1 | 1/2012 | Wegener |
| 2012/0014421 A1 | 1/2012 | Wegener |
| 2012/0014422 A1 | 1/2012 | Wegener |
| 2012/0057572 A1 | 3/2012 | Evans |
| 2012/0183023 A1 | 7/2012 | Filipovic et al. |
| 2012/0202507 A1 | 8/2012 | Zhang et al. |
| 2012/0207206 A1 | 8/2012 | Samardzija et al. |
| 2012/0250740 A1 | 10/2012 | Ling |
| 2012/0307842 A1* | 12/2012 | Petrov et al. .............. 370/474 |
| 2012/0327956 A1 | 12/2012 | Vasudevan |
| 2012/0328121 A1 | 12/2012 | Truman et al. |
| 2014/0208069 A1* | 7/2014 | Wegener .................... 712/22 |
| 2015/0092881 A1* | 4/2015 | Hwang et al. ............. 375/295 |

OTHER PUBLICATIONS

OBSAI Open base Station Architecture Initiative BTS System Reference document Ver. 2.0, Apr. 27, 2006, 151 pages.

OBSAI Open Base Station Architecture Initiative Reference Point 3 Specification Ver. 4.0, Mar. 7, 2007, 119 pages.

K. I. Pendersen. "Frequency domain scheduling for OFMA with limited and noisy channel feedback" 2007 IEEE 66th Vehicular Technology Conference. pp. 1792-1796, Oct. 3, 2007., see section II. C.

Maruyama, S. et al., "Base Transceiver Station for W-CDMA System," Fujitsu Sci. Tech. J. 38,2, p. 167-73, Dec. 2002.

* cited by examiner

800

| Field | Bit Range | Size | Comments |
|---|---|---|---|
| SYNC | [11:0] | 12 bits | 12-bit SYNC word (0x97F) keeps the Decompressor in sync with the incoming packets that are originated at the Compressor |
| Redundancy Removal Order | [13:12] | 2 bits | Filter Mode: (Four Options)<br>00 = Zero order difference<br>01 = First derivative difference<br>10 = $3^{rd}$ order difference<br>11 = double difference |
| Attenuation | [21:14] | 8 bits | Attenuation factor value for lossy compression. Four integer bits for the shifter, four fractional bits for the multiplier (INT[3:0], FRAC[3:0]) |
| Start of Burst | 22 | 1 bit | Indicates to the Decompressor that this current packet represents the start of a burst.<br>0 = Continue current data flow<br>1 = Start of Burst |
| Packet Size | [31:23] | 9 bits | 0x000 = 2 samples<br>0x001 = 4 samples<br>0x002 = 6 samples<br>...<br>0x1FF = 1024 samples |

805 — SYNC
810 — Redundancy Removal Order
815 — Attenuation
820 — Start of Burst
825 — Packet Size

Fig. 8

METHOD AND APPARATUS FOR CONTROLLING ERROR AND IDENTIFYING BURSTS IN A DATA COMPRESSION SYSTEM

BACKGROUND OF THE INVENTION

Transceiver systems in wireless communication networks perform the control functions for directing signals among communicating subscribers, or terminals, as well as communication with external networks. Transceiver systems in wireless communications networks include radio base stations and distributed antenna systems (DAS). For the reverse link, or uplink, a terminal transmits the RF signal received by the transceiver system. For the forward link, or downlink, the transceiver system transmits the RF signal to a subscriber, or terminal, in the wireless network. A terminal may be fixed or mobile wireless user equipment unit (UE) and may be a wireless device, cellular phone, personal digital assistant (PDA), personal computer or other device equipped with a wireless modem.

The rapid increase in data (e.g., video) communication and content consumption has led to expansion of wireless communication networks. As a result, the introduction of next generation communication standards (e.g., 3GPP LTE-A, IEEE 802.16m) has led to improved techniques for data processing, such as carrier aggregation (e.g., 100 MHz) with 8×8 MIMO (Multiple-Input, Multiple-Output) and CoMP (Co-Operative Multi-Point). This in turn has created the need for radio access networks capable of handling wider bandwidths and an increasing number of antennas. These radio access networks will require a higher numbers of fiber links to connect the base stations to the remote radio units. In addition, it is desirable to provide carrier aggregation with Multiple-Input and Multiple-Output (MIMO) and Co-Operative Multipoint (CoMP) techniques to significantly increase spectral efficiency. The implementation of Co-Operative Multipoint techniques requires communication between the baseband units and requires an increasing number of optical or wireless links between the baseband units and the radio units to support the increased data rate achievable with these improved transmission schemes. The increasing number of links required for these techniques results in an undesirable increased infrastructure cost.

Compression techniques can be used to reduce the infrastructure cost by reducing the number of optical or wireless links required to transmit the data as well as by optimizing resources. However, radio access networks often operate in a bursty signaling environment where data is transmitted across the link using bursts of data comprising one or more data packets. Utilizing the compression techniques currently known in the art, it is difficult to limit the propagation of errors across a large number of data signal samples and to identify the burst boundary.

Accordingly, there is a need for a method and apparatus that controls the error propagation to a desired number of signal samples and that is able to identify the burst boundary while achieving an average compression ratio having reasonable degradation.

SUMMARY OF THE INVENTION

The method and apparatus of the present invention provides for the compression and decompression of data bursts wherein the propagation of synchronization errors is limited to a desired number of signal samples and the start of a burst boundary is identified.

In one embodiment of the present invention, a method for data compression and decompression in a communication system includes specifying a packet size variable for a data compression session, the packet size variable identifying the number of signal samples in an uncompressed data packet of the data compression session, specifying a packet size usage variable for the data compression session, the packet size usage variable indicating if the packet size of the uncompressed data packets of the data compression session is static or dynamic, receiving a data burst at a compressor during the data compression session, the data burst comprising a plurality of uncompressed data packets, each of the uncompressed data packets comprising a plurality of signal samples, generating a start of burst parameter and a packet size parameter for each of the plurality of uncompressed data packets and compressing the plurality of uncompressed data packets of the data burst to generate a plurality of compressed data packets, each of the plurality of compressed data packets comprising a header and a payload, the header of each of the plurality of compressed data packets comprising the start of burst parameter for the uncompressed data packet, the packet size parameter for the uncompressed data packet and a synchronization field, the synchronization field identifying the start of the compressed data packet.

After compression of the data packets, the method further includes receiving the plurality of compressed data packets at the decompressor, parsing the header of each of the received plurality of compressed data packets to identify the packet size parameter for each of the plurality of compressed data packets, determining that a synchronization error has occurred for a current compressed data packet of the plurality of compressed data packets. Upon the determination that a synchronization error has occurred, the method further comprises, identifying if the packet size usage variable for the data compression session indicates that the packet size of the plurality of compressed data packets is static or dynamic and if the packet size usage variable indicates that the packet size is static, identifying the packet size variable for the data compression session and looking for the synchronization field in a next compressed data packet of the plurality of compressed data packets after the packet size variable has been reached to reestablish synchronization or if the packet size usage variable indicates that the packet size is dynamic, identifying the packet size parameter for the current compressed data packet and looking for the synchronization field in a next compressed data packet of the plurality of compressed data packets after the packet size parameter for the current compressed data packet has been reached to reestablish synchronization. The method further includes, restoring the data burst from the plurality of compressed data packets using the start of burst parameter, the packet size parameter and the synchronization field in the header of each of the plurality of compressed data packets.

The present invention provides a compression module comprising a compressor and a decompressor. In one embodiment, the compression module comprises a register configured to store a packet size variable for a data compression session, the packet size variable identifying the number of signal samples in an uncompressed data packet of the data compression session, and a register configured to store a packet size usage variable for the data compression session, the packet size usage variable indicating if the packet size of the uncompressed data packets of the data compression session is static or dynamic. The compressor further includes a compression parameter generation module configured to receive a data burst during the compression session, the data burst comprising a plurality of uncompressed data packets and configured to generate a start of burst parameter and a packet size parameter for each of the plurality of uncompressed data packets and a compressed data packet generator coupled to the compression parameter generation module, the compressed data packet generator configured to compress the plurality of data packets of the data burst to generate a plurality of compressed data packets, each of the plurality of compressed data packets comprising a header and a payload, the header of each of the plurality of compressed data packets including the start of burst indicator for the uncompressed data packet, the packet size parameter for the uncompressed data packet and a synchronization field, the synchronization field identifying the start of the compressed data packet. The decompressor is configured to receive a plurality of compressed data packets from a compressor and to decompress the plurality of compressed data packets, the decompressor further comprising an error control module configured to parse the header of each of the received plurality of compressed data packets to identify the packet size parameter for each of the plurality of compressed data packets, and configured to determine if a synchronization error has occurred for a current compressed data packet of the plurality of compressed data packets. If a synchronization error has occurred, the error control module is configured to identify if the packet size usage variable for the data compression session indicates that the packet size of the plurality of compressed data packets is static or dynamic and if the packet size usage variable indicates that the packet size is static, the error control module is configured to identify the packet size variable for the data compression session and configured to look for the synchronization field in a next compressed data packet of the plurality of compressed data packets after the packet size variable has been reached to reestablish synchronization. If the packet size usage variable indicates that the packet size is dynamic, the error control module is configured to identify the packet size parameter for the current compressed data packet and is configured to look for the synchronization field in a next compressed data packet of the plurality of compressed data packets after the packet size parameter for the current compressed data packet has been reached to reestablish synchronization.

BRIEF DESCRIPTION OF DRAWINGS

FIG. 8 is a diagram illustrating a packet header format in accordance with an embodiment of the present invention.

DESCRIPTION OF THE INVENTION

The modular design approach for radio transceiver systems, wherein the baseband processing is separated from the radio frequency processing, has led the industry to develop interface standards. One example of a standard interface for the data transfer interfaces between the radio units and baseband units of transceiver systems is the Common Public Radio Interface (CPRI). Connection topologies between the baseband unit and one or more remote radio units include point-to-point, multiple point-to-point, chain, star, tree, ring and combinations thereof. Another example of an interface specification for modular architecture of radio transceiver systems is the Open Base Station Architecture Initiative (OBSAI). The OBSAI specification describes alternative protocols for the interconnection of baseband modules and remote radio units analogous to the CPRI specification, as well as data transfer protocols for the serial data links.

In conventional cellular communication systems, radio coverage is provided for a given geographic area via multiple base stations distributed throughout the geographic area involved. In this way, each base station can serve traffic in a smaller geographic area. Consequently, multiple base stations in a wireless communication network can simultaneously serve users in different geographic areas, which increases the overall capacity of the wireless network involved.

In order to further increase the capacity of wireless systems, each base station may be configured to support radio coverage in multiple sectors. For example, a base station in a conventional cellular system may be configured to provide radio coverage in one sector, three sectors or six sectors. In those systems employing multiple sectors per base station, each sector can handle part of the traffic in an additional smaller geographic area, which increases the overall capacity of the wireless network involved. Each of the sectors may include multiple remote radio units in communication with each of the base stations. Each of the radio units may further include multiple antennas for both receiving and transmitting data between the radio unit and the user of the communication system.

As described, communication systems are known in the art to include a baseband unit for performing signal processing in communication with a remote radio unit for receiving and transmitting signals to an antenna. The present invention provides a method and apparatus for an efficient compression solution implemented in a data compressor of a communication system.

Figure 1:
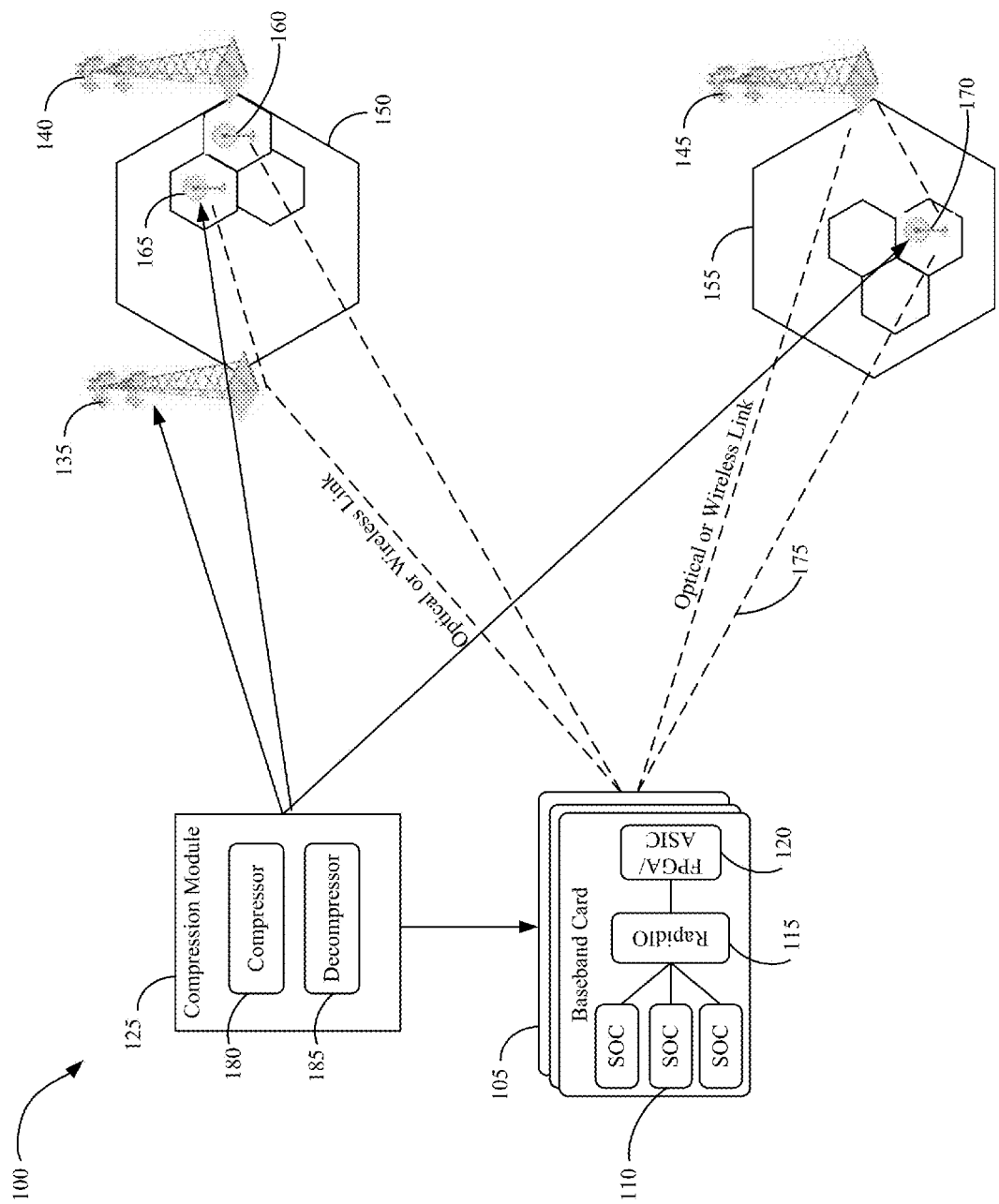
FIG. 1 is an illustration of a communication system architecture in accordance with an embodiment of the present invention.

FIG. 1 illustrates a typical usage of compression and decompression in a radio access network communication system 100. In a centralized radio access network communication system 100, remote radio units 135, 140, 145, 160, 165, 170 may include one or more antennas that may be used to transmit radio frequency data to a user or to receive radio frequency data from a user. Each of the remote radio units is responsible for providing a communication signal within a predetermined coverage area 150, 155. In a particular embodiment, the coverage area may be defined by a macro cell with a small cell overlay. The remote radio units 135, 140, 145, 160, 165, 170 may be coupled to a baseband unit 105 and to each other through a communication link 175. The communication link 175 may be a wireless, wired or optical link. In a particular embodiment, the connection may be a wired CPRI link. The baseband unit 105 may include a plurality of baseband cards and each baseband card may further include a control processor 110 implemented in an SOC (System on a Chip) additional signal processing circuitry 120 implemented in an FPGA or ASIC and a RapidIO interface 115 between the control processor 110 and the signal processing circuitry 120. The control circuit and signal processing circuitry may perform signal processing functions to modulate communication data that were extracted from previously received wireless signals or signals received from an external network to produce digital signals. The signal processing functions depend on the modulation format and can include symbol modulation, channel coding, spreading for CDMA, diversity processing for transmission, time and frequency synchronization, upconverting, multiplexing, and inverse fast Fourier transformation for OFDM. A compression module 125 may be implemented within the baseband unit 105 and/or at one or more of the remote radio units 135, 140, 145, 160, 165, 170. The compression module 125 may include both a compressor 180 and a decompressor 185. The compression module 125 is responsible for compressing the signal samples to be transmitted over the communication link 175 and for decompressing the received signal after transmission over the communication link 175. The compressor 180 and decompressor 185 may be integrated into one circuit, or the compressor 180 and decompressor 185 may be separate circuits.

In a particular embodiment, the signal samples may be compressed at the baseband unit 105 prior to being transmitted to one or more of the remote radio units 135, 140, 145, 160, 165, 170, where the compressed signal samples are then decompressed. Alternatively, the signal samples may also be compressed at the remote radio unit 135, 140, 145, 160, 165, 170, prior to being transmitted to the baseband unit 105, where the compressed signal samples are then decompressed.

In the present invention, the compressor 180 is used to compress the signal samples prior to transmission over the communication link 175 to increase the data throughput of the communication system. Compressing the data prior to transmission over the wireless link also allows for a reduction in the number of antennas that are necessary to transmit the signal samples between the baseband unit 105 and the remote radio units 135, 140, 145, 160, 165, 170.

The radio units 135, 140, 145, 160, 165, 170 may be operating in the same sector or in different sectors. In operation, the radio units 135, 140, 145, 160, 165, 170 may receive data from the baseband unit 105, or from another one of the radio units 135, 140, 145, 160, 165, 170.

In a communication system operating in an uplink mode, radio frequency data is received from a user at an antenna associated with a remote radio unit 135, 140, 145, 160, 165, 170 to be transmitted to a baseband unit 105. The radio frequency data received at the remote radio unit is sampled and converted to digital data and additional data processing may be applied to the data at the radio unit 135, 140, 145, 160, 165, 170. The data is then compressed at the compression module 125 of the radio unit 135, 140, 145, 160, 165, 170 and then transmitted from the radio unit 135, 140, 145, 160, 165, 170 to the baseband unit 105 for further processing.

In a communication system operating in a downlink mode, data may be transmitted from the baseband unit 105 to a remote radio unit 135, 140, 145, 160, 165, 170 for subsequent transfer of the data to a user via an antenna in communication with the remote radio unit 135, 140, 145, 160, 165, 170. The signal samples received at the baseband unit 105 are converted to digital data and additional data processing may be applied to the signal samples at the baseband unit 105. The signal samples are then compressed at the compression module 125 of the baseband unit 105 and then transmitted from the baseband unit 105 to one or more of the remote radio units 135, 140, 145, 160, 165, 170 for further processing.

Figure 2:
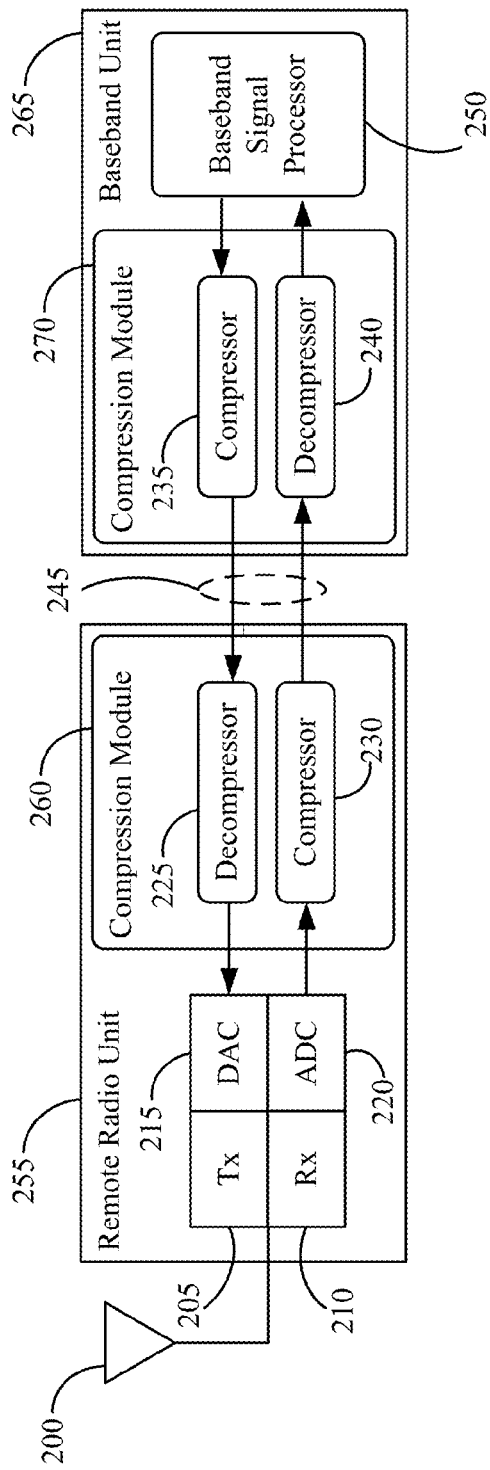
FIG. 2 is a block diagram illustrating a general base station architecture that incorporates compression and decompression.

FIG. 2 is a block diagram illustrating a communication system architecture that incorporates compression and decompression. With reference to FIG. 2, the communication system architecture includes a baseband unit 265 connected by one or more serial communication links 245 to a remote radio unit 255. This general architecture can be used for any air interface standard employed by wireless communication networks, including GSM/EDGE, CDMA based modulation formats, OFDM base modulation formats such as WiMax and other signal modulation formats that may evolve. The remote radio unit 255 may be located near the antenna 200 on an antenna tower. The remote radio unit 255 may be connected to multiple antennas for transmission, reception, diversity or beamforming. The serial communication link 245 may be implemented by fiber optic, coaxial cable or RJ-45 twisted pair. The baseband unit 265 performs signal processing functions to prepare data for transmission by the remote radio unit 255 or recovers data from signal samples received from the remote radio unit 255. The signal processing functions performed by the baseband unit 254 may include symbol modulation/demodulation, channel coding/decoding, spreading/de-spreading for CDMA, diversity processing for transmission/reception, interference cancellation, equalization, time and frequency synchronization, upconverting/downconverting, multiplexing/demultiplexing and data transport to/from an external network.

For the transmit path, or downlink, the baseband signal processor 250 of the baseband unit 265 performs the signal processing functions to modulate communication data that were extracted from previously received wireless signals or received from an external network to produce digital signals. The signal processing functions depend on the modulation format and can include symbol modulation, channel coding, spreading for CDMA, diversity processing for transmission, time and frequency synchronization, upconverting, multiplexing and inverse discrete Fourier transformation for OFDM. The compressor 235 of the compression module 270 compresses the samples of the digital signal prior to transfer over a communication link 245 to the remote radio unit 255. At the remote radio unit 255, the decompressor 225 of the compression module 260 decompresses the compressed samples to reconstruct the digital signal before digital to analog conversion. The digital to analog converter (DAC) 215 of the remote radio unit 255 converts the reconstructed digital signal to an analog signal. The transmitter (Tx) 205 prepares the analog signal for transmission by the antenna 200, including up-conversion to the appropriate radio frequency, RF filtering and amplification.

For the receive path, or uplink, antenna 200 at the remote radio unit 255 receives an RF analog signal representing modulated communication data from one or more wireless sources, or subscribers. The frequency band of the received signal may be a composite of transmitted signals from multiple wireless subscribers. Depending on the air interface protocol, different subscriber signals can be assigned to certain frequency channels or multiple subscribers can be assigned to a particular frequency band. The receiver (Rx) 210 of the remote radio unit 255 performs analog operations of the RF analog signal, including RF filtering, amplification and down-conversion to shift the center frequency of the received signal. The analog to digital converter (ADC) 220 of the remote radio unit 255 converts the received analog signal to a digital signal to produce signal samples that have only real values, or alternatively, have in phase (I) and quadrature (Q) components, based upon the system design. The compressor 230 of the remote radio unit 255 applies compression to the digital signal samples before transmission over the communication link 245. At the baseband unit 265, the decompressor 240 of the compression module 270 decompresses the compressed samples to reconstruct the digital signal prior to performing the normal signal processing at the baseband signal processor 250 to recover communication data from the decompressed digital signal. The processing operations may include demodulating symbols, channel decoding, dispreading (for CDMA modulation formats), diversity processing, interference cancelling, equalizing, time and frequency synchronization, downconverting, demultiplexing, discrete Fourier transformation (for OFDM modulation formats) and transporting data derived from the decompressed signal samples to an external network.

Figure 3:
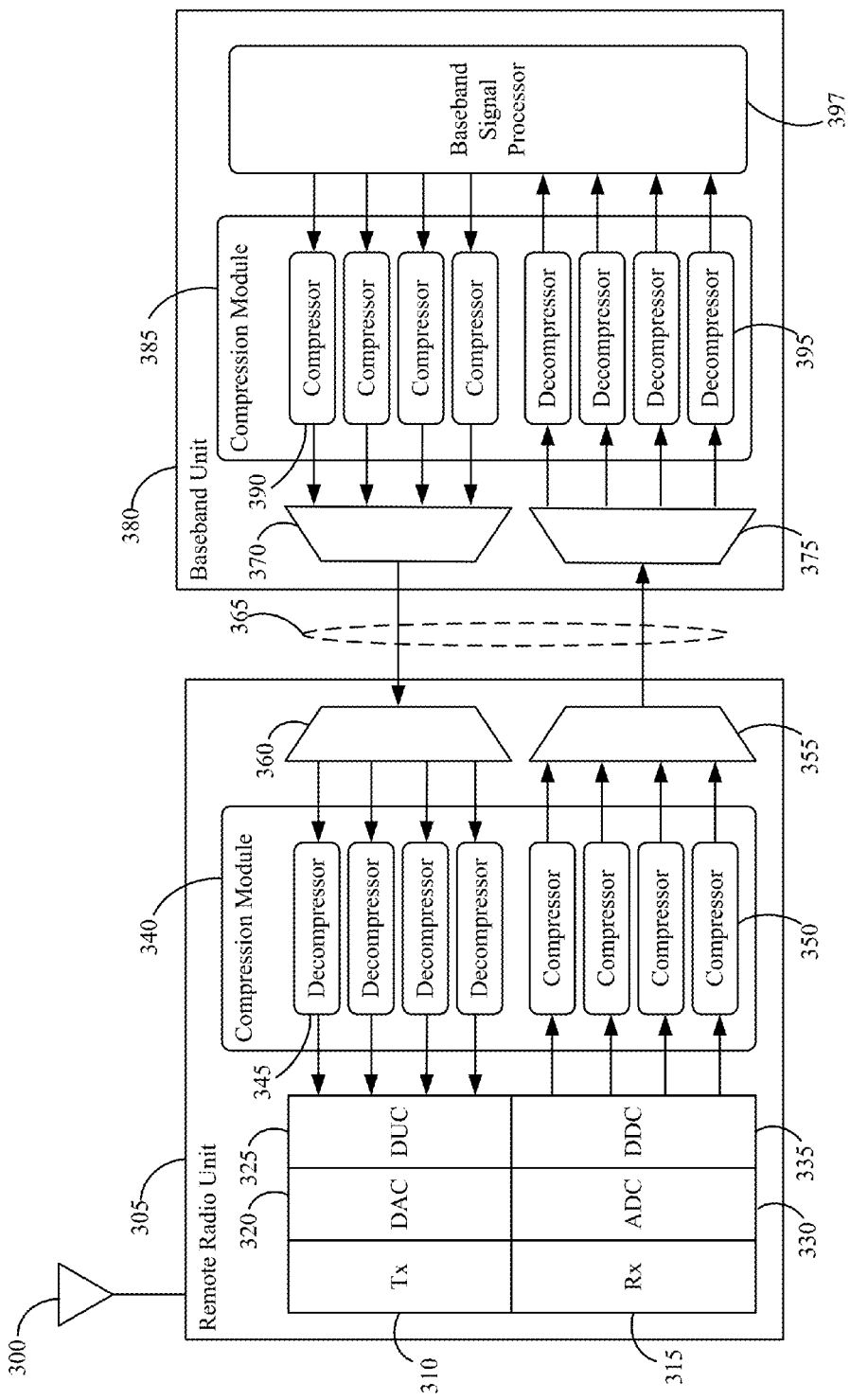
FIG. 3 is a block diagram illustrating compression and decompression where multiple signal channels are compressed and multiplexed before transfer over a communication link in accordance with an embodiment of the present invention.

FIG. 3 is a block diagram of compression and decompression in accordance with the present invention, wherein multiple signal channels are compressed and multiplexed before transfer over a communication serial data link. Both OBSAI and CPRI transceivers may receive and transmit multiple frequency channels of signal samples for each independent antenna, or multiple antenna-carriers. With reference to FIG. 3, there are four channels of signal samples representing four antenna-carriers. The signal samples comprise baseband I and Q samples. For the transmit path, each compressor 390 of the compression module 385 at the baseband unit 380 independently compresses a stream of baseband I,Q signal samples to form corresponding streams of compressed samples. The multiplexer 370 multiplexes the compressed samples into a single serial data stream for transfer over serial data communication link 365 in accordance with the standard. At the remote radio unit 305, the demultiplexer 360 demultiplexes the serial data stream to recover the four streams of compressed samples in accordance with the standard. At the remote radio unit 305, each decompressor 345 of the compression module 340 decompresses one stream of compressed samples to reconstruct the corresponding baseband I,Q signal samples. The digital upconverter (DUC) 325 of the remote radio unit 305 upconverts each stream of decompressed signal samples to respective carrier frequencies to form a channelized signal. Each upconverted digital signal may occupy a particular channel of the resulting channelized signal. The digital to analog converter (DAC) 320 of the remote radio unit 305 converts the channelized signal to an analog signal. The transmitter 310 of the remote radio unit 305 converts the analog signal to the appropriate RF frequency for transmission by the antenna 300.

Additionally, with reference to FIG. 3, for the receive path, the receiver (Rx) 315 of the remote radio unit 305 receives the RF signal and the ADC 330 digitizes the received signal to produce a digital signal that represents a channelized signal data as previously described for the transmit path. The digital down converter (DDC) 335 of the remote radio unit downconverts each channel to form corresponding streams of baseband I,Q signal samples, one for each channel. The compressors 350 of the compression module 340 compress the received signal samples to form compressed samples. The multiplexer 355 multiplexes the streams of compressed samples output from the compressors 350 to form a serial data stream in accordance with the OBSAI or CPRI standards. The serial data stream is transferred via the serial data communication link 365 to the baseband unit 380. The demultiplexer 375 at the baseband unit 380 demultiplexes the serial data to restore the four streams of compressed samples. Each decompressor 395 of the compression module 385 reconstructs the corresponding I,Q signal samples prior to performing normal operations by the baseband signal processor 397.

Figure 4:
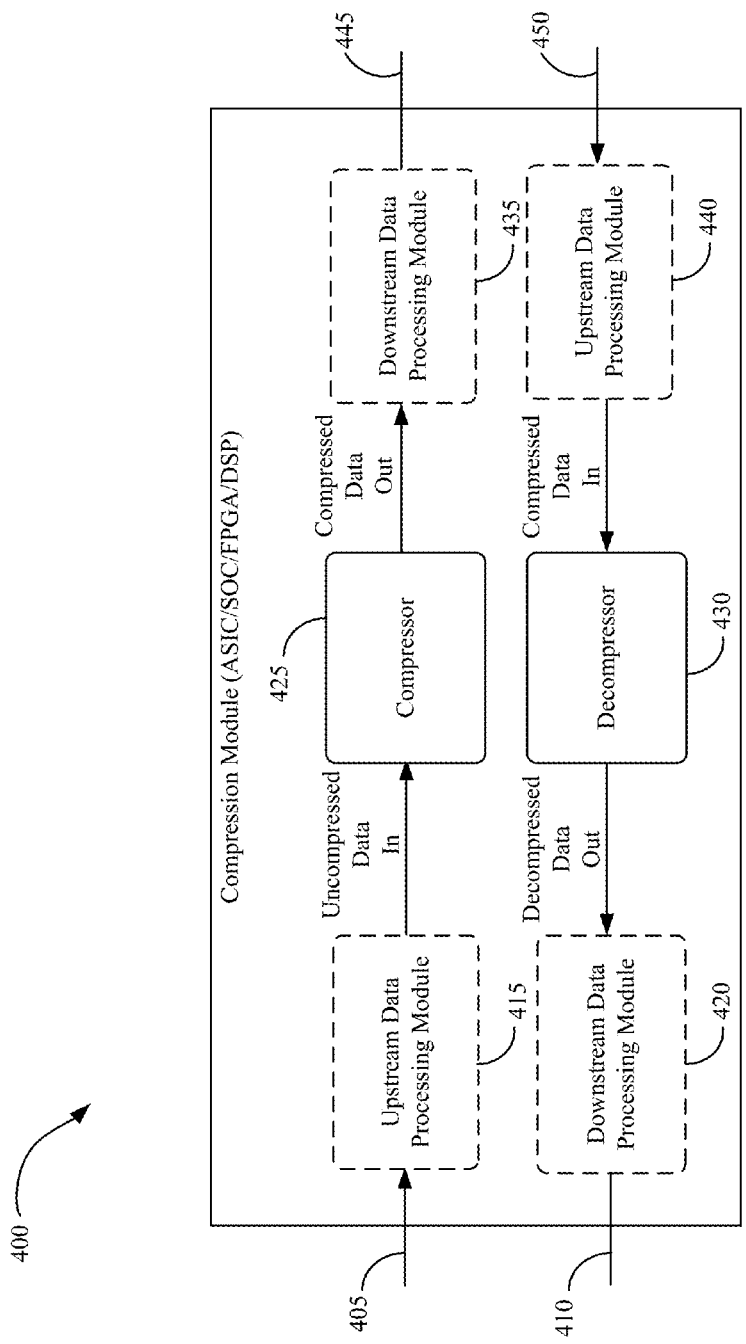
FIG. 4 is a block diagram illustrating compression module that includes a compressor and a decompressor in accordance with an embodiment of the present invention.

With reference to FIG. 4, a compression module 400 in accordance with the present invention may be implemented in an ASIC, SOC, FPGA or DSP, as previously described. The compression module 400 may be located at the baseband unit or alternatively at one or more of the remote radio units. In an additional embodiment, a compression module 400 may be located at both the baseband unit and at one or more of the remote radio units. The compression module 400 may include a compressor 425, a decompressor 430, one or more upstream data processing modules 415, 440 and one or more downstream processing modules 420, 435.

In a particular embodiment, the compression module is located at the baseband unit. In a downlink mode of operation, signal samples 405 to be transmitted to one or more of the remote radio units may be processed at the baseband unit. The compression module 400 at the baseband unit preprocesses the signal data utilizing an upstream data processing module 415. The preprocessed data from the upstream data processing module 415 is then transmitted to a compressor 425. The compressor 425 then compresses the signal data and provides the compressed signal data to a downstream data processing module 435 for additional processing prior to transmitting the compressed signal 445 to the remote radio units. In an uplink mode of operation, compressed signal data 450 is received at the compression module 400 located at the baseband unit from one or more of the remote radio units. An upstream data processing module 440 preprocesses the compressed signal data received from the remote radio units prior provides the compressed data to the decompressor 430 of the baseband unit. The decompressor 430 then decompresses the compressed signal data. The decompressed signal data is then provided to a downstream data processing module 420 for additional processing prior to transmitting the decompressed signal data 410 from the compression module 400 of the baseband unit.

In an additional embodiment, the compression module 400 may be located at one of the remote radio units. In this embodiment, in an uplink mode of operation, signal data 405 to be transmitted to the baseband unit from one or more of the remote radio units is received from an end user or subscriber. The compression module 400 of the remote radio unit preprocesses the signal data utilizing an upstream data processing module 405. The preprocessed data from the upstream data processing module 405 is then transmitted to a compressor 425. The compressor 425 compresses the signal data and provides the compressed signal samples to a downstream data processing module 435 for additional processing prior to transmitting the compressed signal 445 to the baseband unit. In a downlink mode of operation, compressed signal data 450 is received at one or more of the remote radio units from the baseband unit. An upstream data processing module 440 preprocesses the compressed signal data received from the baseband unit prior to providing the compressed data to the decompressor 430 of the compression module 400. The decompressor 430 then decompresses the compressed signal samples. After decompression, the decompressed signal samples are provided to a downstream data processing module 420 for additional processing prior to transmitting the decompressed signal data 410 from the compression module 400 of the remote radio unit.

Radio access networks often operate in a bursty signaling environment, wherein the data transmitted across the links is organized into bursts of data packets. In general, a data packet is a formatted unit of data comprising a header, which carries control information for the packet, and a payload. When data is formatted into packets, the bandwidth of the radio access network can be better shared among the baseband units and remote radio units. In a bursty signaling environment, one or more data packets are aggregated and transmitted together. Sending a burst of packets, instead of a continuous stream of packets, requires less transmission processing overhead and more data packets can be transmitted during a given time period. Utilizing data bursts comprising one or more data packets therefore increases the throughput of the network by reducing the transmission overhead.

To further increase the network throughput is a bursty signaling environment, it is desirable to compress the data packets of the data burst prior to transmission of the packets over the link between the compressor and decompressor. However, prior art compression techniques are designed to compress continuous streams of data packets and do not effectively address the unique nature of data bursts. Additionally, when an error occurs in the data burst requiring resynchronization of the compressor and decompressor, the prior art compression techniques are unable to control the propagation of the error and resynchronization may be delayed over the data burst.

Figure 5:
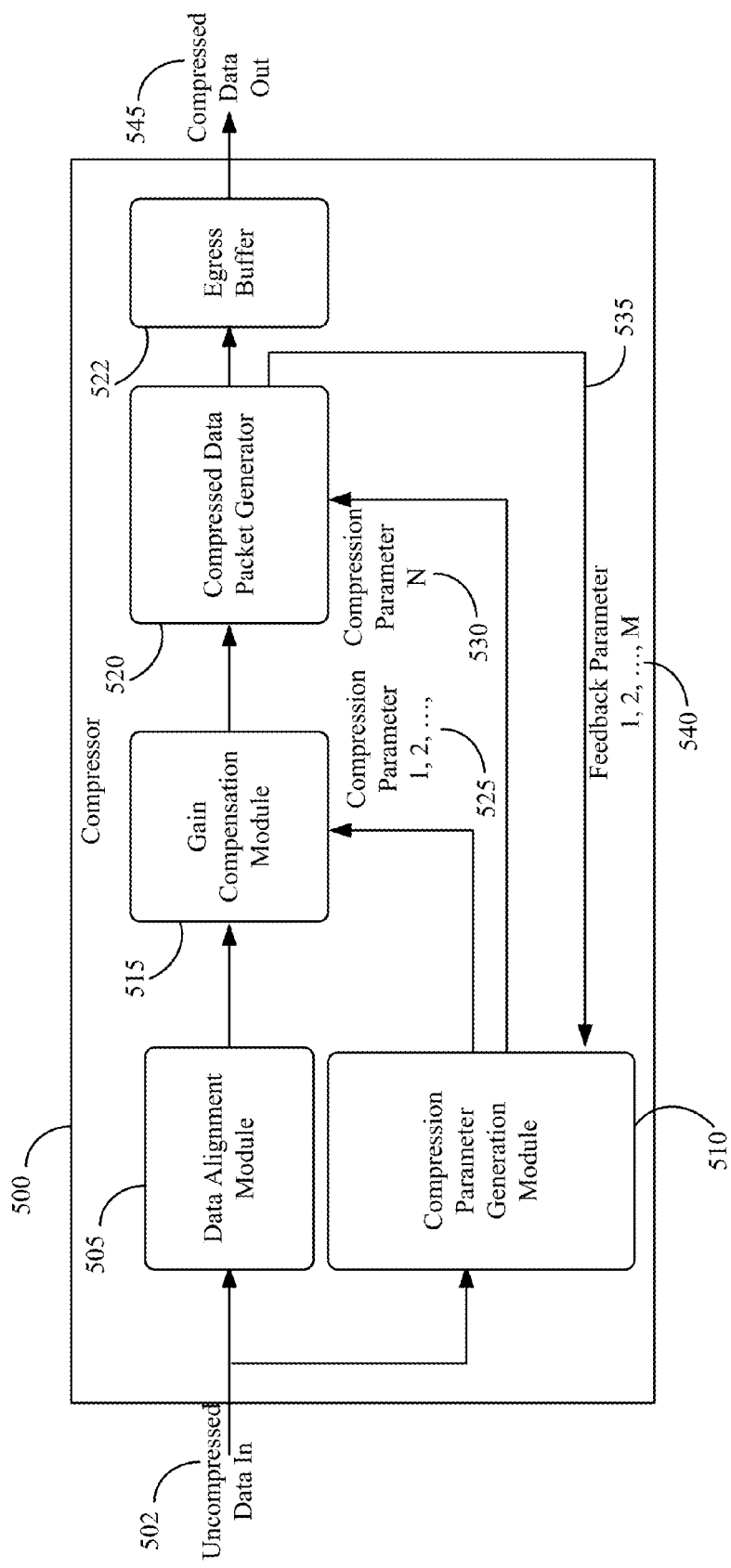
FIG. 5 is a block diagram illustrating a compressor in accordance with an embodiment of the present invention.

With reference to FIG. 5, a compressor 500 of a compression module 400 is configured to receive a data burst during a compression session, the data burst comprising a plurality of uncompressed data packets 502, and configured to compress the uncompressed data packets to generate a plurality of compressed data packets 545. A compression session may include one or more data bursts. The compressor 500 may include a data alignment module 505. The data alignment module 505 is configured to receive the uncompressed data packets 502 and to align the uncompressed data packets 502. The compressor may include a gain compensation module 515 coupled to the data alignment module 505. The gain compensation module 515 is configured to receive the plurality of aligned, uncompressed data packets from the data alignment module 505 and to adjust the gain of the uncompressed data packets.

The compressor includes a compression parameter generation module 510 coupled to the gain compensation module 515. The compression parameter generation module 510 is configured to receive the data burst comprising the plurality of uncompressed data packets 502 and is configured to generate a plurality of compression parameters 525, 530, including a start of burst parameter and a packet size parameter for each of the plurality of uncompressed data packets. The compression parameter generation module 510 provides the compression parameters 525, 530 to the gain compensation module 515 and to a compressed data packet generator 520 coupled to the compression parameter generation module 510. The compressed data packet generator 520 is configured to compress the plurality of data packets of the data burst to generate a plurality of compressed data packets, each of the plurality of compressed data packets comprising a header and a payload, the header of each of the plurality of compressed data packets comprising the start of burst indicator for the uncompressed data packet, the packet size parameter for the uncompressed data packet and a synchronization field, the synchronization field identifying the start of the compressed data packet. Additionally, the compressed data packet generator 520 may analyze the compressed data packets and provide one or more feedback parameters 540 through a feedback path 535 to the compression parameter generation module 510. The feedback parameters 540 may be used to adjust the compression parameters 525, 530 generated by the compression parameter generation module 510.

The compressor 500 may further include an egress buffer 522 coupled to the compressed data packet generator 520. The egress buffer is configured to store the plurality of compressed data packets 545 prior to transmission to a decompressor.

Figure 6:
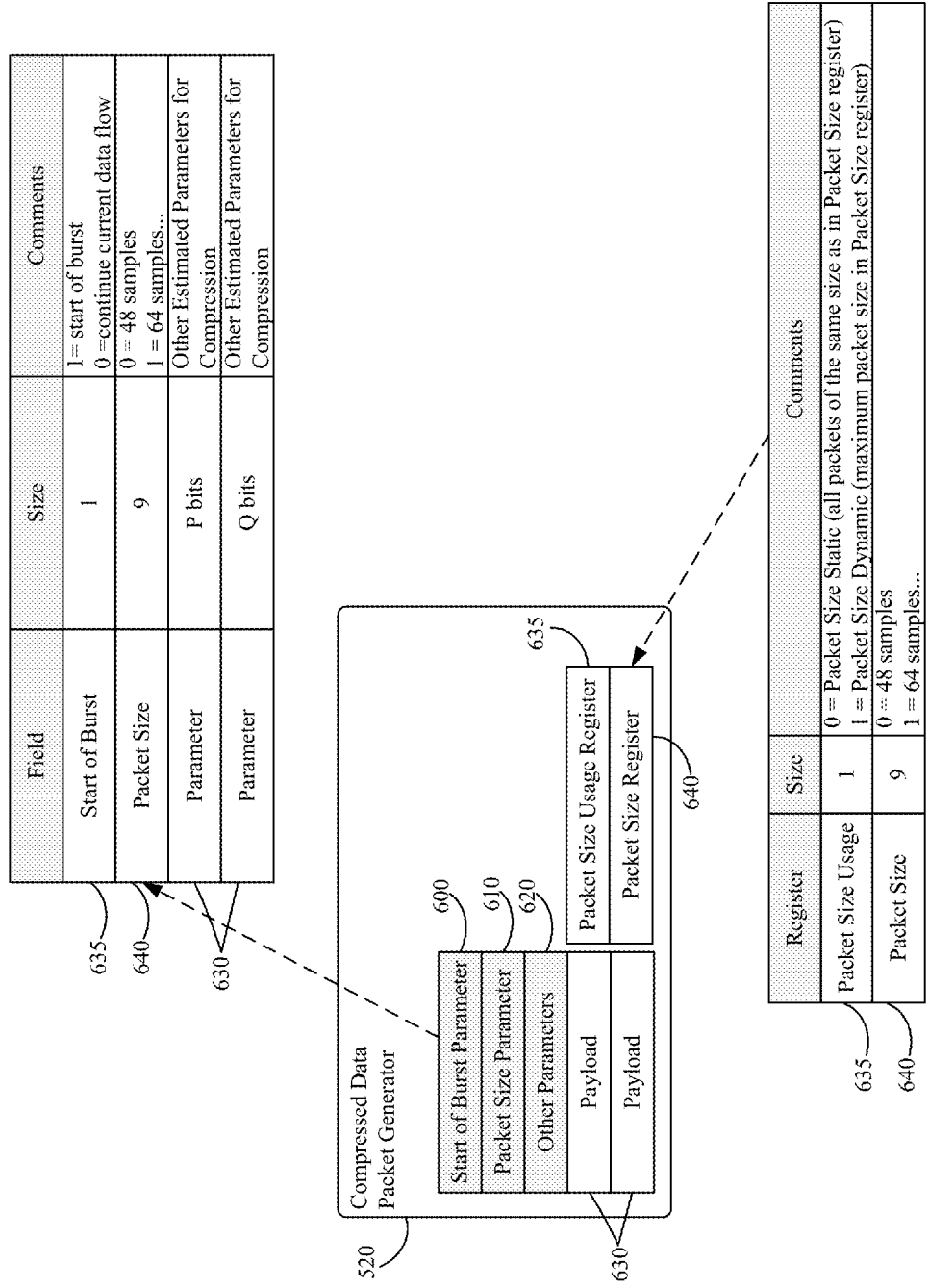
FIG. 6 is a block diagram illustrating a compressed data packet generator accordance with an embodiment of the present invention.

With reference to FIG. 6, the start of burst parameter 600 generated by the compressed data packet generator 520 for each of the plurality of uncompressed data packets identifies an uncompressed data packet as the first data packet in a burst. In an exemplary embodiment, if the start of burst parameter 600 of an uncompressed data packet is set to "1", the packet is the first packet in the data burst. Alternatively, if the start of burst parameter 600 of an uncompressed data packet is set to "0", the packet is not the first packet in the data burst and is instead a continuation of the current data flow. Additionally, the packet size parameter 610 generated by the compressed data packet generator 520 for each of the plurality of uncompressed data packets identifies the size (number of samples) in the uncompressed data packet. In an exemplary embodiment, if the packet size parameter 610 of an uncompressed data packet is set to "1", the size of the packet is 64 samples. Alternatively, if the packet size parameter 610 of an uncompressed data packet is set to "0", the packet size of the packet is 48 samples. In addition to the start of burst parameter 600 and the packet size parameter 610, the compressed data packet generator 520 may generate other estimated parameters 620. These other estimated parameters 620 may include signal gain parameters, encoding parameters and entropy reduction value parameters. The compressed data packet generator 520 utilizes the start of burst parameter 600, the packet size parameter 610, and the other estimated parameters 620 to generate the compressed data packets. The start of burst parameter 600, the packet size parameter 610, and the other estimated parameters 620 are stored in a header and combined with the payload 630 of the data packet to generate the compressed data packet prior to transmission of the compressed data packet to the decompressor.

The compressed data packet generator 520 of the compressor 500 further includes a register 640 configured to store a packet size variable for a data compression session, the packet size variable identifying the number of signal samples in an uncompressed data packet of the data compression session and a register 635 configured to store a packet size usage variable for the data compression session, the packet size usage variable indicating if the packet size of the uncompressed data packets of the data compression session is static or dynamic. The packet size usage variable 635 and packet size variable 640 may be predetermined and defined by an end user of the system. Additionally, the packet size usage variable 635 and packet size variable 640 may be different for different compression sessions. In an exemplary embodiment, if the packet size usage variable 635 is equal to "0", then the packet size is considered to be static and all of the packets will be the same size as specified by the packet size variable 640. Alternatively, if the packet size usage variable 635 is equal to "1", then the packet size is considered to be dynamic and the packets may be of varying sizes and the packet size variable 640 specifies the maximum packet size for any packet during the compression session.

Figure 7:
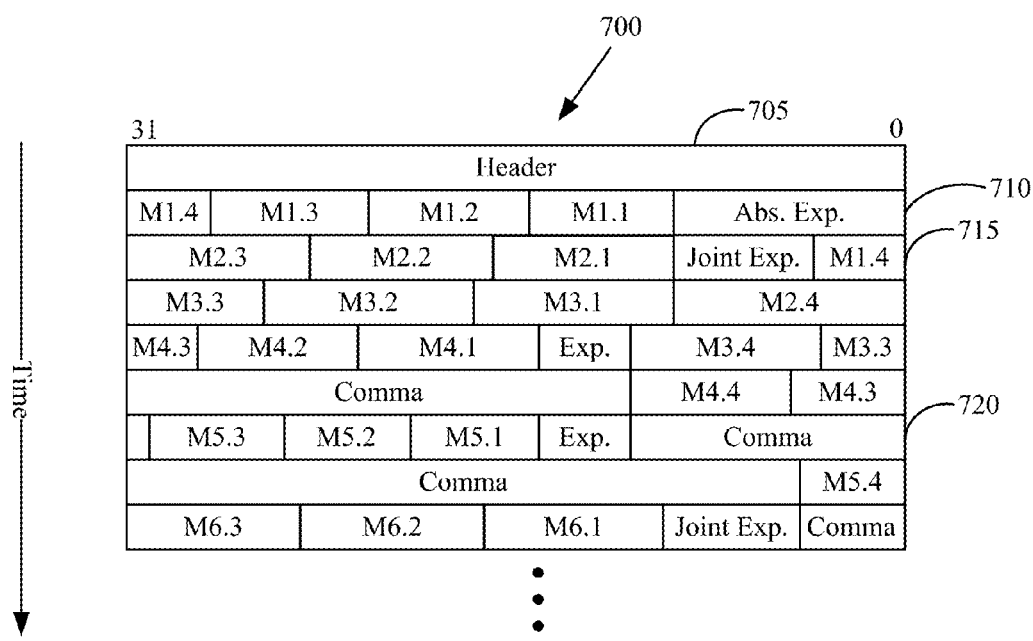
FIG. 7 is diagram illustrating a packet format in accordance with an embodiment of the present invention.

With reference to FIG. 7, in an exemplary embodiment, the compressed data packet generator 520 of the compressor 500 is configured for generating a compressed packet 700 that includes a header field 705, a plurality of mantissa 715 (Mx.x denotes mantissa), comma characters 720 (32-bit 0xFFFF_FFFF characters that the compressor sends), and exponents 710 (Abs. Exp., Joint Exp. and Exp.), wherein the exponents 710 define groups of mantissa 715. In the exemplary embodiment, the packet header 705 identifies the compression parameters used to compress the packet. With reference to FIG. 8, the packet header format 800 includes a plurality of fields, including a SYNC field 805, a redundancy removal field 810, an attenuation field 815, a start of burst field 820 and a packet size field 825. The SYNC field 805 contains a 12-bit SYNC word that keeps the decompressor in sync with the incoming packets that are generated by the compressor. The redundancy removal order field 810 identifies the filter used by the compressor in the compression of the packet. The attenuation field 815 identifies the attenuation factor value for the lossy compression of the packet. The start of burst indicator field 820 indicates whether or not the packet is the start of a burst. The packet size field 825 indicates the number of sample of the packet.

Figure 9:
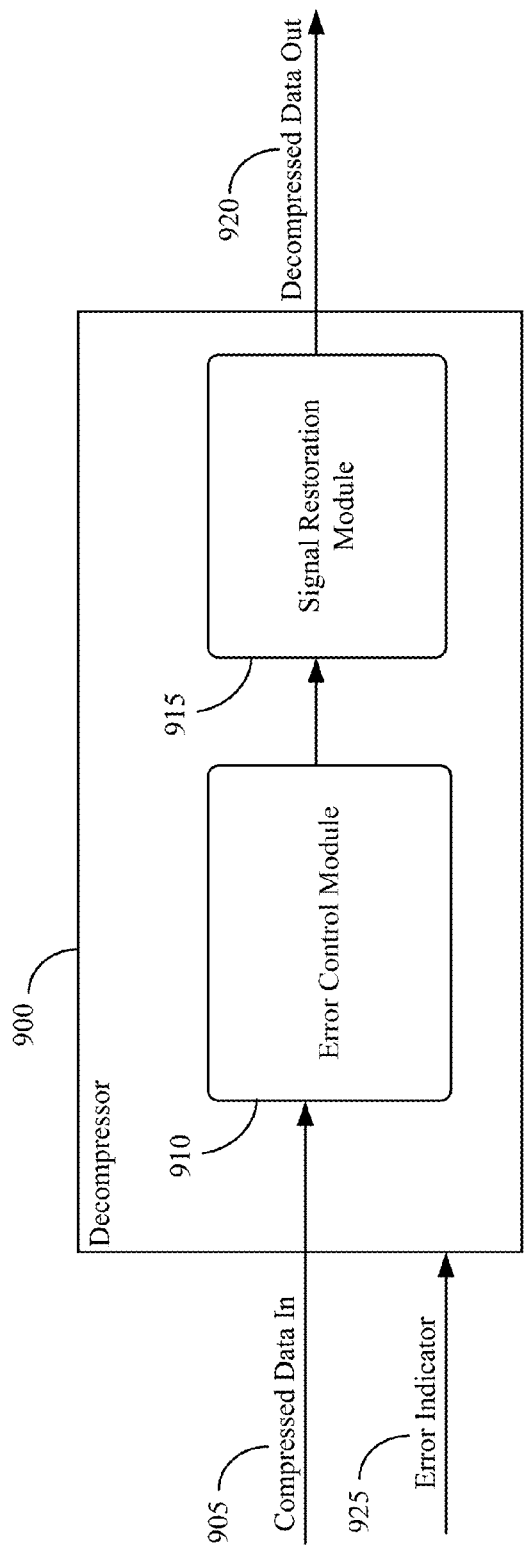
FIG. 9 is a block diagram illustrating a decompressor in accordance with an embodiment of the present invention.

With reference to FIG. 9, the compression module 400 includes a decompressor 900 configured to receive the plurality of compressed data packets 905 from the compressor and to decompress the plurality of compressed data packets to generate decompressed data packets 920. The decompressor 900 includes an error control module 910 configured to parse the header of each of the received plurality of compressed data packets to identify the packet size parameter for each of the plurality of compressed data packets. The error control module 910 is further configured to determine if a synchronization error has occurred for a current compressed data packet of the plurality of compressed data packets. If the error control module 910 determines that a synchronization error has occurred, the error control module 910 is further configured to identify if the packet size usage variable 635 for the data compression session indicates that the packet size of the plurality of compressed data packets is static or dynamic and if the packet size usage variable 635 indicates that the packet size is static, the error control module 910 is configured to identify the packet size variable 640 for the data compression session and configured to look for the synchronization field in a next compressed data packet of the plurality of compressed data packets after the packet size variable 640 has been reached to reestablish synchronization or if the packet size usage variable 635 indicates that the packet size is dynamic, the error control module 910 configured to identify the packet size parameter 610 for the current compressed data packet and configured to look for the synchronization field in a next compressed data packet of the plurality of compressed data packets after the packet size parameter 610 for the current compressed data packet has been reached to reestablish synchronization.

Figure 10:
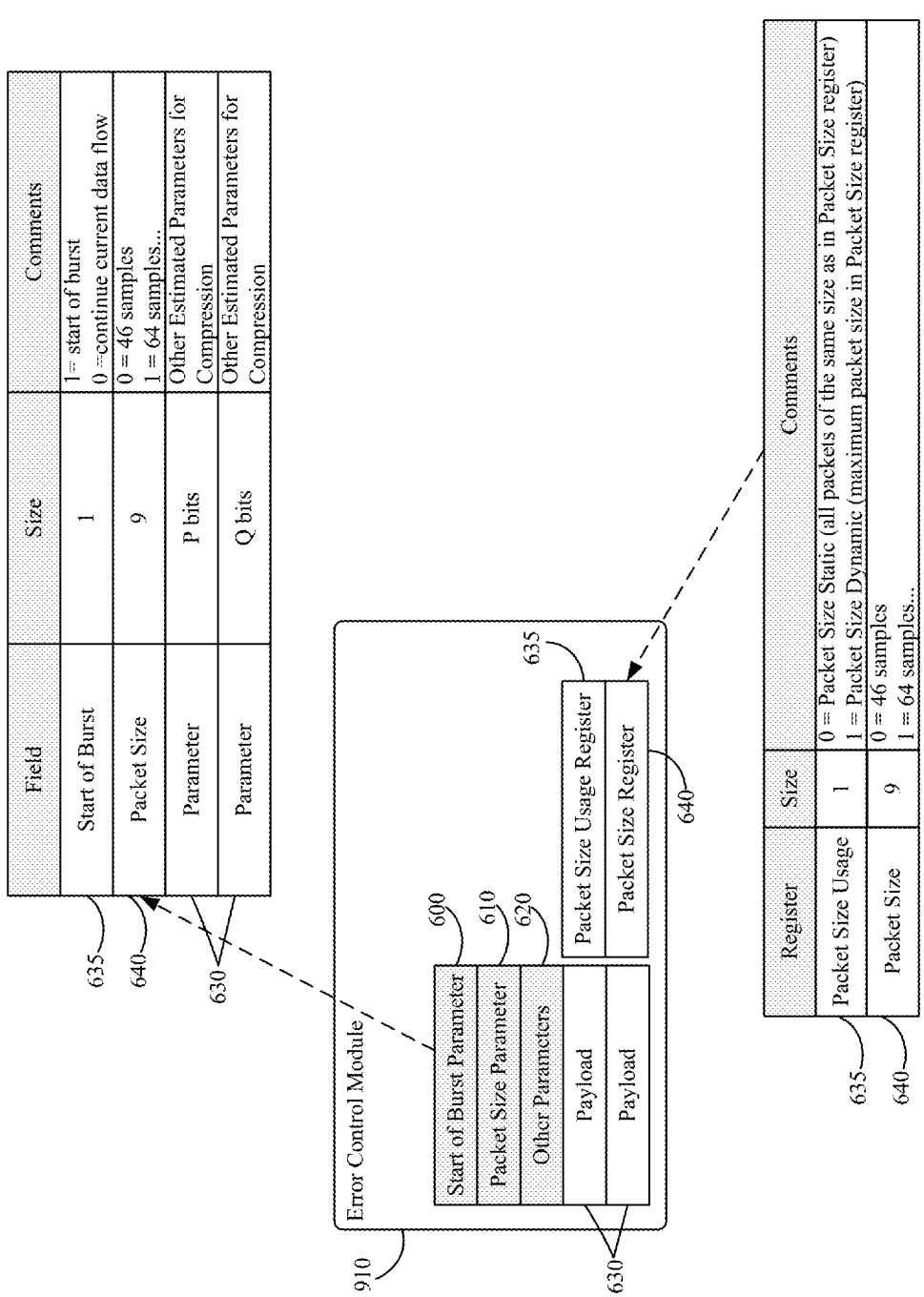
FIG. 10 is a block diagram illustrating an error control module in accordance with an embodiment of the present invention.

As shown with reference to FIG. 10, the error control module 910 shares the packet size usage register 635 and the packet size register 640 with the compression parameter generation module 510. Additionally, the start of burst parameter 600, packet size parameter 610 and other estimated parameters 620 generated by the compression parameter generation module 510 for each of the plurality of compressed data packets are provided to the error control module 910 through the header of the compressed data packet. The error control module 910 is configured to parse the header of each of the plurality of compressed data packets to identify the start of burst parameter 600, packet size parameter 610 and other estimated parameters 620 for each of the plurality of compressed data packets.

The decompressor 900 further comprises a signal restoration module 915 coupled to the error control module 910, the signal restoration module 915 is configured to restore the data burst from the plurality of compressed data packets using the start of burst parameter 600, the packet size parameter 610 and the synchronization field in the header of each of the plurality of compressed data packets.

The decompressor 900 may further include an error indicator 925 as an input to the decompressor. The error indicator 925 may indicate that a synchronization error has occurred for a current compressed data packet of the plurality of compressed data packets. In one embodiment, the error indicator 925 may indicate an error in the current compressed data packet as a result of a checksum mismatch. In an alternate embodiment, the error control module is 910 may be configured to look for the synchronization field for the next compressed data packet in the data burst after the packet size parameter for the current compressed data packet has been reached and to determine that a synchronization error has occurred if the synchronization field for the next compressed data packet is not located after the packet size parameter for the current compressed data packet has been reached.

Figure 11:
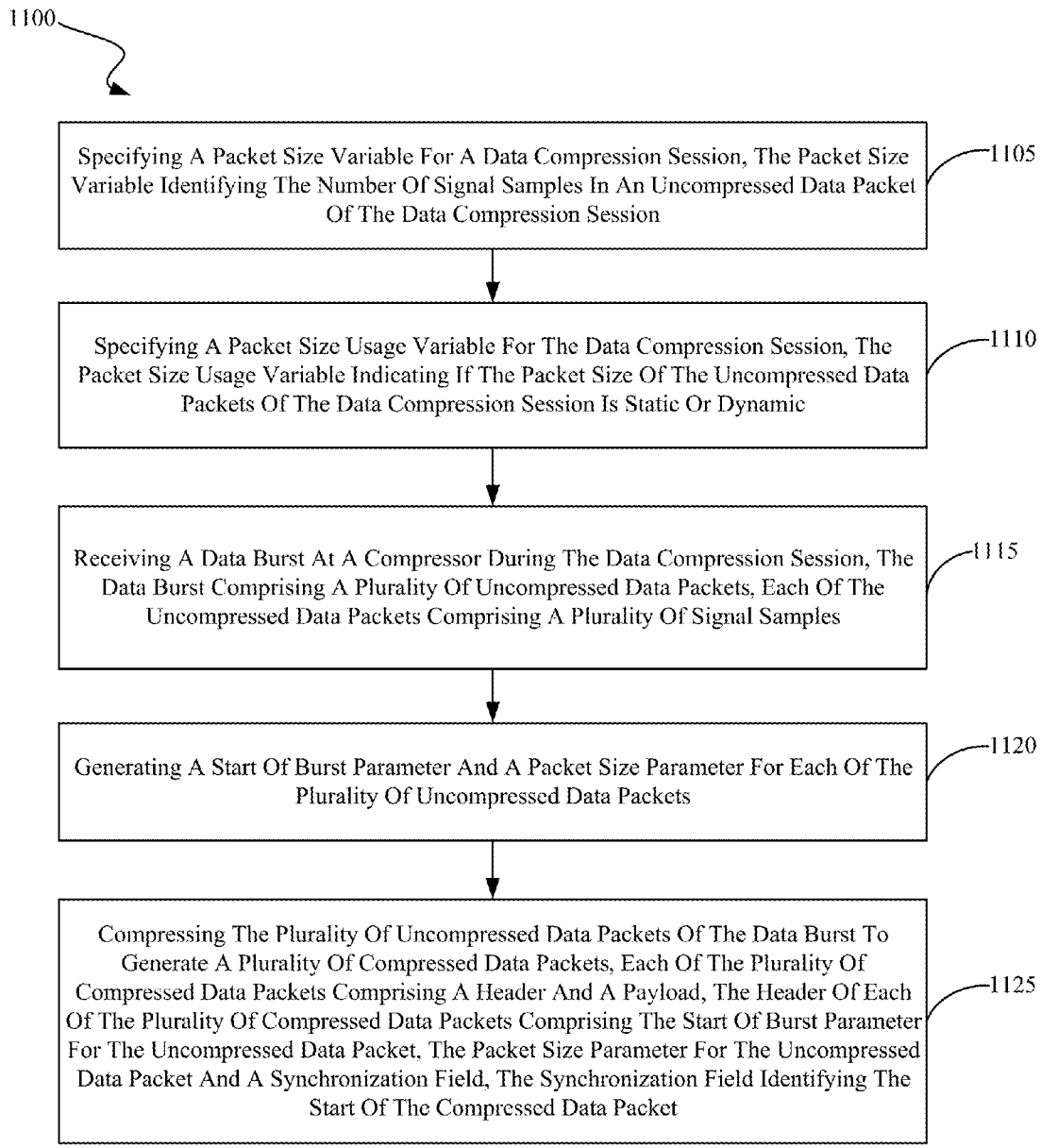
FIG. 11 is a flow diagram illustrating a method of compression in accordance with an embodiment of the present invention.

With reference to FIG. 11, a method of data compression 1100 is shown that includes specifying a packet size variable for a data compression session, the packet size variable identifying the number of signal samples in an uncompressed data packet of the data compression session 1105 and specifying a packet size usage variable for the data compression session, the packet size usage variable indicating if the packet size of the uncompressed data packets of the data compression session is static or dynamic 1110. In one embodiment, the packet size and packet size usage may be predetermined and may be provided by a user of the compression module. The method may further include, receiving a data burst at a compressor during the data compression session, the data burst comprising a plurality of uncompressed data packets, each of the uncompressed data packets comprising a plurality of signal samples 1115. In one embodiment, the data burst may be received at a compressor 500. After the data burst has been received, the method may further include, generating a start of burst parameter and a packet size parameter for each of the plurality of uncompressed data packets 1120 and compressing the plurality of uncompressed data packets of the data burst to generate a plurality of compressed data packets, each of the plurality of compressed data packets comprising a header and a payload, the header of each of the plurality of compressed data packets comprising the start of burst parameter for the uncompressed data packet, the packet size parameter for the uncompressed data packet and a synchronization field, the synchronization field identifying the start of the compressed data packet 1125. Generating a start of burst parameter and a packet size parameter for each of the plurality of uncompressed data packets 1120 may further include determining, for each of the plurality of uncompressed data packets, if the uncompressed data packet is the first uncompressed data packet of the data burst and if the uncompressed data packet is the first uncompressed data packet of the data burst, generating the start of burst parameter for the uncompressed data packet indicating that the uncompressed data packet is the first packet in the data burst and determining, for each of the plurality of uncompressed data packets, the number of signal samples in the uncompressed data packet and generating a packet size parameter for the uncompressed data packet. Additionally, the method may further include storing the packet size variable in a register of the compressor and in a register of the decompressor and storing the packet size usage variable in a register of the compressor and in a register of the decompressor. In one embodiment, generating a start of burst parameter and a packet size parameter for each of the plurality of uncompressed data packets 1120 and compressing the plurality of uncompressed data packets of the data burst to generate a plurality of compressed data packets, each of the plurality of compressed data packets comprising a header and a payload, the header of each of the plurality of compressed data packets comprising the start of burst parameter for the uncompressed data packet, the packet size parameter for the uncompressed data packet and a synchronization field, the synchronization field identifying the start of the compressed data packet 1125 may be performed by a compression parameter generation module 510 of the compressor 500.

Figure 12:
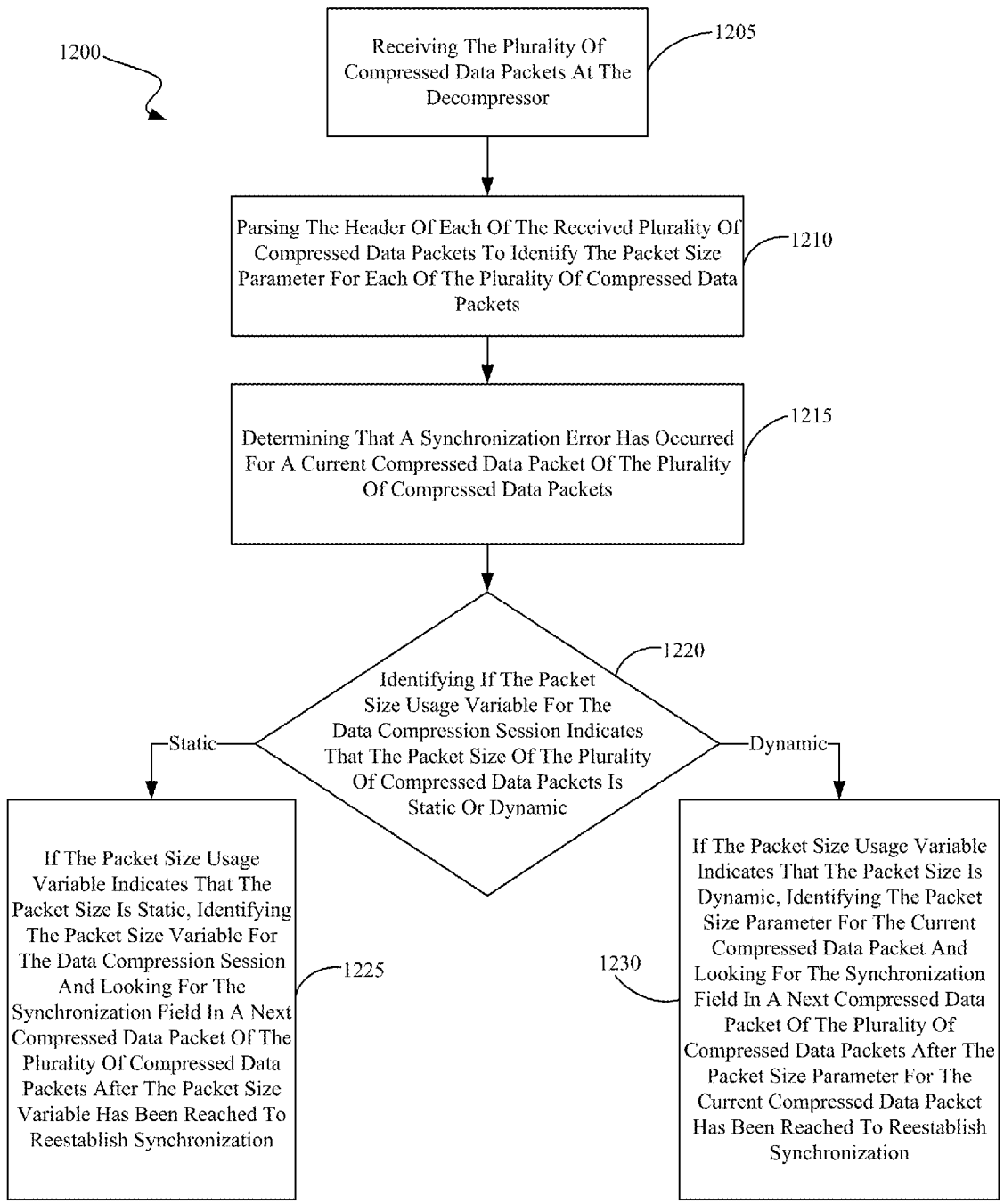
FIG. 12 is a flow diagram illustrating a method of decompression in accordance with an embodiment of the present invention.

With reference to FIG. 12, a method of decompressing data 1200 is shown, the method includes receiving the plurality of compressed data packets at the decompressor 1205. In one embodiment, the plurality of compressed data packets at the decompressor may be received at a decompressor 900. After the compressed data packets have been received, the method further includes, parsing the header of each of the received plurality of compressed data packets to identify the packet size parameter for each of the plurality of compressed data packets 1210 and determining that a synchronization error has occurred for a current compressed data packet of the plurality of compressed data packets 1215. In one embodiment, parsing the header of each of the received plurality of compressed data packets to identify the packet size parameter for each of the plurality of compressed data packets 1210 and determining that a synchronization error has occurred 1215 is performed by the error control module 910 of the decompressor 900. Determining that a synchronization error has occurred 1215 may further include receiving an error indicator at an input of the decompressor. Alternatively, determining that a synchronization error has occurred 1215 may further comprise looking for the synchronization field for the next compressed data packet in the data burst after the packet size parameter for the current compressed data packet has been reached and determining that a synchronization error has occurred if the synchronization field for the next compressed data packet is not located after the packet size parameter for the current compressed data packet has been reached. Following the determination that a synchronization has occurred for a current compressed data packet of the plurality of compressed data packets, the method may further include identifying if the packet size usage variable for the data compression session indicates that the packet size of the plurality of compressed data packets is static or dynamic 1220 and if the packet size usage variable indicates that the packet size is static, identifying the packet size variable for the data compression session and looking for the synchronization field in a next compressed data packet of the plurality of compressed data packets after the packet size variable has been reached to reestablish synchronization 1225 or if the packet size usage variable indicates that the packet size is dynamic, identifying the packet size parameter for the current compressed data packet and looking for the synchronization field in a next compressed data packet of the plurality of compressed data packets after the packet size parameter for the current compressed data packet has been reached to reestablish synchronization 1230. In one embodiment, identifying if the packet size usage variable for the data compression session indicates that the packet size of the plurality of compressed data packets is static or dynamic 1220 and if the packet size usage variable indicates that the packet size is static, identifying the packet size variable for the data compression session and looking for the synchronization field in a next compressed data packet of the plurality of compressed data packets after the packet size variable has been reached to reestablish synchronization 1225 or if the packet size usage variable indicates that the packet size is dynamic, identifying the packet size parameter for the current compressed data packet and looking for the synchronization field in a next compressed data packet of the plurality of compressed data packets after the packet size parameter for the current compressed data packet has been reached to reestablish synchronization 1230 may be performed by the error control module 910 of the decompressor 900. Following resynchronization, the method may further include restoring the data burst from the plurality of compressed data packets using the start of burst parameter, the packet size parameter and the synchronization field in the header of each of the plurality of compressed data packets.

The compression module of the present invention may be used in the generation of compressed data packets for transmission within a communication system and in the decompression of the compressed data packets. In the present invention, the packet size is provided by the compressor and is stored in a register that is available at the decompressor. When the decompressor determines that a synchronization error has occurred, the decompressor can begin looking for the synchronization field in the data packet header as soon as the packet size is reached. Without the knowledge of the packet size, the decompressor would not begin looking for the synchronization field until the maximum packet size was reached. With the packet size information available at the decompressor, the decompressor does not need to wait for the maximum packet size to be reached before attempting resynchronization. As such, the decompressor of the present invention can more quickly recover from a synchronization error, thereby limiting the error propagation to a minimum number of samples.

Additionally, the compressor of the present invention generates a start of burst parameter and stores the start of burst parameter in the header of the data packets. The decompressor is then able to parse the header of the data packet to retrieve the start of burst parameter and to restore the data burst from the plurality of compressed data packets using the start of burst parameter, the packet size parameter and the synchronization field in the header of each of the plurality of compressed data packets. Knowing the start of burst parameter, the decompressor is adaptable to operate in a bursty signaling environment that may suffer from synchronization errors.

As is known in the art, the compressor may be implemented in a Field Programmable Gate Array (FPGA), an Application-Specific Integrated Circuit (ASIC) or a variety of other commonly known integrated circuit devices. The implementation of the invention may include both hardware and software components.

The invention claimed is:

1. A method for data compression and decompression in a communication system, the method comprising:
specifying a packet size variable for a data compression session, the packet size variable identifying the number of signal samples in an uncompressed data packet of the data compression session;
specifying a packet size usage variable for the data compression session, the packet size usage variable indicating if the packet size of the uncompressed data packets of the data compression session is static or dynamic;
receiving a data burst at a compressor during the data compression session, the data burst comprising a plurality of uncompressed data packets, each of the uncompressed data packets comprising a plurality of signal samples;
generating a start of burst parameter and a packet size parameter for each of the plurality of uncompressed data packets; and
compressing the plurality of uncompressed data packets of the data burst to generate a plurality of compressed data packets, each of the plurality of compressed data packets comprising a header and a payload, the header of each of the plurality of compressed data packets comprising the start of burst parameter for the uncompressed data packet, the packet size parameter for the uncompressed data packet and a synchronization field, the synchronization field identifying the start of the compressed data packet, wherein the packet size parameter and the synchronization field from the header of each of the plurality of compressed data packets are used to reestablish synchronization between the compressor and a decompressor when a synchronization error occurs.

2. The method of claim 1, further comprising:
receiving the plurality of compressed data packets at the decompressor;
parsing the header of each of the received plurality of compressed data packets to identify the packet size parameter for each of the plurality of compressed data packets; and
determining that a synchronization error has occurred for a current compressed data packet of the plurality of compressed data packets;
identifying if the packet size usage variable for the data compression session indicates that the packet size of the plurality of compressed data packets is static or dynamic; and
if the packet size usage variable indicates that the packet size is static, identifying the packet size variable for the data compression session and looking for the synchronization field in a next compressed data packet of the plurality of compressed data packets after the packet size variable has been reached to reestablish synchronization between the compressor and the decompressor; or
if the packet size usage variable indicates that the packet size is dynamic, identifying the packet size parameter for the current compressed data packet and looking for the synchronization field in a next compressed data packet of the plurality of compressed data packets after the packet size parameter for the current compressed data packet has been reached to reestablish synchronization between the compressor and the decompressor.

3. The method of claim 2, further comprising parsing the header of each of the plurality of compressed data packets to identify the start of burst parameter for each of the plurality of compressed data packets.

4. The method of claim 3, further comprising restoring the data burst from the plurality of compressed data packets using the start of burst parameter, the packet size parameter and the synchronization field in the header of each of the plurality of compressed data packets.

5. The method of claim 1, wherein generating a start of burst parameter and a packet size parameter for each of the plurality of uncompressed data packets further comprises:
determining, for each of the plurality of uncompressed data packets, if the uncompressed data packet is the first uncompressed data packet of the data burst and if the uncompressed data packet is the first uncompressed data packet of the data burst, generating the start of burst parameter for the uncompressed data packet indicating that the uncompressed data packet is the first packet in the data burst; and
determining, for each of the plurality of uncompressed data packets, the number of signal samples in the uncompressed data packet and generating a packet size parameter for the uncompressed data packet.

6. The method of claim 2, further comprising storing the packet size variable in a register of the compressor and in a register of the decompressor.

7. The method of claim 2, further comprising storing the packet size usage variable in a register of the compressor and in a register of the decompressor.

8. The method of claim 2, wherein determining that a synchronization error has occurred for a current compressed data packet of the plurality of compressed data packets further comprises receiving an error indicator at an input of the decompressor.

9. The method of claim 2, wherein determining that a synchronization error has occurred for a current compressed data packet of the plurality of compressed data packets further comprises looking for the synchronization field for the next compressed data packet in the data burst after the packet size parameter for the current compressed data packet has been reached and determining that a synchronization error has occurred if the synchronization field for the next compressed data packet is not located after the packet size parameter for the current compressed data packet has been reached.

10. The method of claim 1, further comprising generating at least one estimated compression parameter and compressing the plurality of uncompressed data packets of the data burst to generate a plurality of compressed data packets having the at least one estimated compression parameter in the header of each of the plurality of compressed data packets.

11. A compression module comprising:
a compressor, further comprising:
a compression parameter generation module configured to receive a data burst during the compression session, the data burst comprising a plurality of uncompressed data packets and configured to generate a start of burst parameter and a packet size parameter for each of the plurality of uncompressed data packets; and a compressed data packet generator coupled to the compression parameter generation module, the compressed data packet generator configured to compress the plurality of data packets of the data burst to generate a plurality of compressed data packets, each of the plurality of compressed data packets comprising a header and a payload, the header of each of the plurality of compressed data packets comprising the start of burst parameter for the uncompressed data packet, the packet size parameter for the uncompressed data packet and a synchronization field, the synchronization field identifying the start of the compressed data packet, wherein the packet size parameter and the synchronization field from the header of each of the plurality of compressed data packets are used to reestablish synchronization between the compressor and a decompressor when a synchronization error occurs.

12. The compression module of claim 11, further comprising:
a register configured to store a packet size variable for a data compression session, the packet size variable identifying the number of signal samples in an uncompressed data packet of the data compression session;
a register configured to store a packet size usage variable for the data compression session, the packet size usage variable indicating if the packet size of the uncompressed data packets of the data compression session is static or dynamic;
a decompressor configured to receive the plurality of compressed data packets from the compressor and to decompress the plurality of compressed data packets, the decompressor further comprising;
an error control module configured to parse the header of each of the received plurality of compressed data packets to identify the packet size parameter for each of the plurality of compressed data packets, and configured to determine if a synchronization error has occurred for a current compressed data packet of the plurality of compressed data packets and if a synchronization error has occurred, the error control module is further configured to identify if the packet size usage variable for the data compression session indicates that the packet size of the plurality of compressed data packets is static or dynamic; and
if the packet size usage variable indicates that the packet size is static, the error control module configured to identify the packet size variable for the data compression session and configured to look for the synchronization field in a next compressed data packet of the plurality of compressed data packets after the packet size variable has been reached to reestablish synchronization between the compressor and the decompressor or if the packet size usage variable indicates that the packet size is dynamic, the error control module configured to identify the packet size parameter for the current compressed data packet and configured to look for the synchronization field in a next compressed data packet of the plurality of compressed data packets after the packet size parameter for the current compressed data packet has been reached to reestablish synchronization between the compressor and the decompressor.

13. The compression module of claim 12, wherein the error control module is further configured to parse the header of each of the plurality of compressed data packets to identify the start of burst parameter for each of the plurality of compressed data packets.

14. The compression module of claim 13, wherein the decompressor further comprises a signal restoration module coupled to the error control module, the signal restoration module configured to restore the data burst from the plurality of compressed data packets using the start of burst parameter, the packet size parameter and the synchronization field in the header of each of the plurality of compressed data packets.

15. The compression module of claim 11, wherein the compression parameter generation module is further configured to determine, for each of the plurality of uncompressed data packets, if the uncompressed data packet is the first uncompressed data packet of the data burst and if the uncompressed data packet is the first uncompressed data packet of the data burst, the compression parameter generation module further configured to generate the start of burst parameter for the uncompressed data packet indicating that the uncompressed data packet is the first packet in the data burst.

16. The compression module of claim 11, wherein the compression parameter generation module is further configured to determine, for each of the plurality of uncompressed data packets, the number of signal samples in the uncompressed data packet and to generate a packet size parameter for the uncompressed data packet equal to the number of signal samples.

17. The compression module of claim 12, further comprising an error indicator input port coupled to the decompressor, the error indicator input port to receive an input indicating that a synchronization error has occurred for a current compressed data packet of the plurality of compressed data packets.

18. The compression module of claim 12, wherein the error control module is further configured to look for the synchronization field for the next compressed data packet in the data burst after the packet size parameter for the current compressed data packet has been reached and to determine that a synchronization error has occurred if the synchronization field for the next compressed data packet is not located after the packet size parameter for the current compressed data packet has been reached.

19. The compression module of claim 11, wherein the compression parameter generation module is further configured to generate at least one estimated compression parameter.

20. A compression module configured to compress data in a communication system, the compression module comprising:
a first register configured to store a packet size variable for a data compression session, the packet size variable identifying the number of signal samples in an uncompressed data packet of the data compression session;
a second register configured to store a packet size usage variable for the data compression session, the packet size usage variable indicating if the packet size of the uncompressed data packets of the data compression session is static or dynamic;
a compressor configured to compress data in the communication system, the compressor further comprising;
a compression parameter generation module configured to receive a data burst during the compression session, the data burst comprising a plurality of uncompressed data packets and configured to generate a start of burst parameter and a packet size parameter for each of the plurality of uncompressed data packets;

a compressed data packet generator coupled to the compression parameter generation module, the compressed data packet generator configured to compress the plurality of data packets of the data burst to generate a plurality of compressed data packets, each of the plurality of compressed data packets comprising a header and a payload, the header of each of the plurality of compressed data packets comprising the start of burst parameter for the uncompressed data packet, the packet size parameter for the uncompressed data packet and a synchronization field, the synchronization field identifying the start of the compressed data packet;

a decompressor configured to receive the plurality of compressed data packets from the compressor and to decompress the plurality of compressed data packets, the decompressor further comprising;

an error control module configured to parse the header of each of the received plurality of compressed data packets to identify the packet size parameter for each of the plurality of compressed data packets, and configured to determine if a synchronization error has occurred for a current compressed data packet of the plurality of compressed data packets and if a synchronization error has occurred, the error control module further configured to identify if the packet size usage variable for the data compression session indicates that the packet size of the plurality of compressed data packets is static or dynamic; and if the packet size usage variable indicates that the packet size is static, the error control module configured to identify the packet size variable for the data compression session and configured to look for the synchronization field in a next compressed data packet of the plurality of compressed data packets after the packet size variable has been reached to reestablish synchronization between the compressor and the decompressor or if the packet size usage variable indicates that the packet size is dynamic, the error control module configured to identify the packet size parameter for the current compressed data packet and configured to look for the synchronization field in a next compressed data packet of the plurality of compressed data packets after the packet size parameter for the current compressed data packet has been reached to reestablish synchronization between the compressor and the decompressor.

* * * * *